United States Patent [19]
Green et al.

[11] Patent Number: 5,654,975
[45] Date of Patent: Aug. 5, 1997

[54] SCANNING LASER BEAM DELIVERY SYSTEM

[75] Inventors: Steven Green, Greenbelt, Md.; Thirumalai Venketesan, Washington, D.C.; Kalpesh Patel, Aberdeen, Md.

[73] Assignee: Neocera, Inc., Beltsville, Md.

[21] Appl. No.: 625,228

[22] Filed: Apr. 1, 1996

[51] Int. Cl.[6] .................................................. H01S 3/10
[52] U.S. Cl. .............................. 372/24; 372/101; 372/103
[58] Field of Search ................................ 372/24, 101, 103

*Primary Examiner*—Leon Scott, Jr.
*Attorney, Agent, or Firm*—Morton J. Rosenberg; David I. Klein

[57] ABSTRACT

There is provided a scanning laser beam delivery system for use in pulsed laser deposition of a target evaporant (40) onto a substrate (50). The system includes a laser beam source (10) for generating a pulsed laser beam, a beam transfer assembly (20) optically coupled to laser beam source (10) for directing the generated pulse laser beam along an optical path (15) having a terminal segment (15') which impinges upon target evaporant (40); and, a control mechanism (30) coupled to beam transfer assembly (20). Beam transfer assembly (20) includes a scanning mechanism (22) for reversibly translating terminal segment (15') of optical path (15) along a scan direction substantially normal to the direction along which terminal segment (15') has a directional component. Actuation of scanning mechanism (22) is automatically controlled by control mechanism (30).

20 Claims, 5 Drawing Sheets

SCANNING LASER BEAM DELIVERY SYSTEM

BACKGROUND OF THE INVENTION

The present invention is directed to a beam delivery system for use in pulsed laser deposition of a target evaporant onto a substrate. More specifically, it is directed to a scanning laser beam delivery system for obtaining optimally uniform deposition of a target evaporant onto the given substrate.

In known physical vapor deposition techniques such as sputtering, the coupling of energy and evaporant sources resulting from the free electrochemical interactions of the cathode, the target, and the sputtering gas makes uniform deposition extremely difficult. In contrast to these techniques, the pulsed laser deposition technique employed in the present invention essentially decouples in the deposition process the energy and evaporant sources such that uniform deposition becomes practicable. In a typical pulsed laser deposition arrangement, an evaporant source, or target, is placed within a vacuum environment along with, and in close proximity to, a substrate onto which the evaporant material is to be deposited. A pulsed laser beam generated by an energy source located outside the vacuum environment is directed into the vacuum environment to impinge upon a portion of the target. This causes the formation of a highly forward-directed evaporant plume which emanates from that portion of the target radiated by the pulsed laser beam toward the substrate. The particles contained in that evaporant plume are thereby deposited into the substrate's surface.

One significant drawback with the technique just described derives from the fact that the evaporant plume thus generated is characterized by a non-uniform distribution of its constituent particles. Much like the cloud of paint ejected from a spray paint can, the outer fringes of the plume tend to exhibit significantly less particle concentration than that exhibited in its central portions. Absent external means to compensate for or nullify this factor, therefore, uniform deposition, even with the pulsed laser deposition technique, remains very difficult.

One approach to addressing this inherent deficiency in the pulsed laser deposition technique, as envisioned by the present invention, is to introduce into a pulsed laser deposition arrangement automatically-controlled means for scanning that portion of the pulsed laser beam directly impinging upon the given target.

Obtaining high uniformity Of deposition, however, is not a trivial matter; and, measures must be taken in employing this laser beam scan to insure that the energy density of the laser beta radiation incident on the target is maintained at a constant level at all times during the deposition process. Moreover, measures must be taken to precisely control the laser beam scan so as to coordinate with any and all concurrent manipulations of both the target and substrate. Otherwise, deposition uniformity along all portions of a substrate deposition surface of more than a nominal surface area may not be realized.

SUMMARY OF THE INVENTION

Accordingly, it is an object of the present invention to effect uniform deposition of material contained in a target evaporant onto a substrate using a pulsed laser deposition technique.

It is another object of the present invention to scan that portion of a pulsed laser beam directly impinging upon a target evaporant in a pulsed laser deposition system.

It is another object of the present invention to scan that portion of the pulsed laser beam directly impinging upon a target substrate in a manner that preserves the focus of the beam and thereby maintains a consistent laser radiation energy density incident on the target evaporant during the deposition process.

It is another object of the present invention to automatically control laser beam scanning in a manner necessitated by various system operation parameters to effect uniform deposition.

It is yet another object of the present invention to control laser beam scanning responsive to any rotation of the target evaporant and/or the substrate in a manner that optimizes deposition uniformity along all portions of a substrate deposition surface of more than a nominal surface area.

These and other objects are attained in the present invention which provides for a scanning laser beam delivery system for use in pulsed laser deposition of a target evaporant onto a substrate rotating about a substrate axis. The scanning laser beam delivery system includes a laser beam source for generating a pulsed laser beam; a beam transfer assembly optically coupled to the laser beam source for directing the generated pulsed laser beam along an optical path having a terminal segment impinging upon the target evaporant to form a radiation beam spot; and, a control mechanism coupled to the beam transfer assembly. The terminal segment of the pulsed laser beam's optical path is oriented such that it maintains a directional component parallel to a longitudinal direction. The beam transfer assembly includes a scanning mechanism for reversibly translating this terminal segment of the optical path along a scan direction substantially normal to the longitudinal direction. Actuation of the scanning mechanism is automatically controlled by the control mechanism.

In a preferred embodiment of the scanning laser beam delivery system, the beam transfer assembly includes first and second mirror elements which cooperatively direct the generated pulsed laser beam along at least a portion of the optical path, the first mirror element being disposed adjacent the laser beam source. The beam transfer assembly also includes in that preferred embodiment an aperture element placed in the optical path for blocking substantially all portions of the passing pulsed laser beam not within a predetermined portion of that beam. A focusing lens is placed adjacent the aperture element so as to focus the predetermined portion of the host laser beam passing therethrough onto at least a portion of the target evaporant. The second mirror element, the aperture element, and the focusing lens are mounted on a cross-beam. The cross-beam is coupled to the scanning mechanism to be reversibly displaceable in the scan direction.

The control mechanism is preferably a programmable controller which controls the scanning mechanism responsive to a plurality of operational parameters. These operational parameters include any manipulation of either or both of the target evaporant or the substrate.

In the preferred embodiment, both the target evaporant and the substrate are rotated about respective rotation axes at independent rotation rates. The control mechanism controls actuation of the scanning mechanism to reversibly translate the optical path's terminal segment in the scan direction at a variable scan rate. The scan rate is inversely proportional to a deposition point parameter indicative, at any given time, of the instantaneous radial position relative to the substrate axis of an evaporant deposition point on the surface of the substrate. The resulting scan is performed in such manner that the beam spot shape and beam spot size characterizing the radiation beam spot on the target evaporant are both substantially preserved.

DESCRIPTION OF THE PREFERRED EMBODIMENTS

Figure 1:
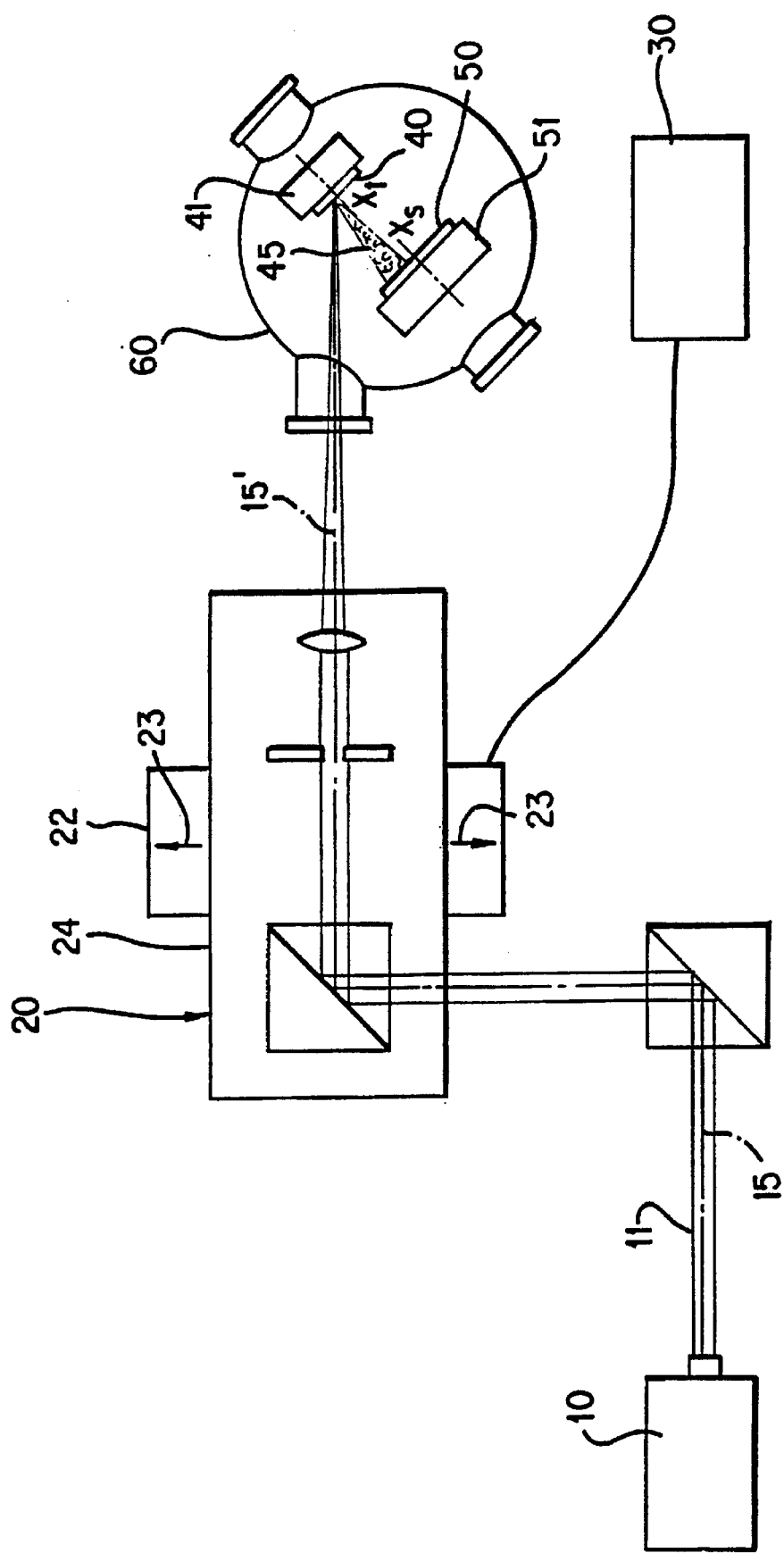
FIG. 1 is a schematic diagram illustrating a preferred operational arrangement incorporating the scanning laser beam delivery system of the present invention.
Figure 1A:
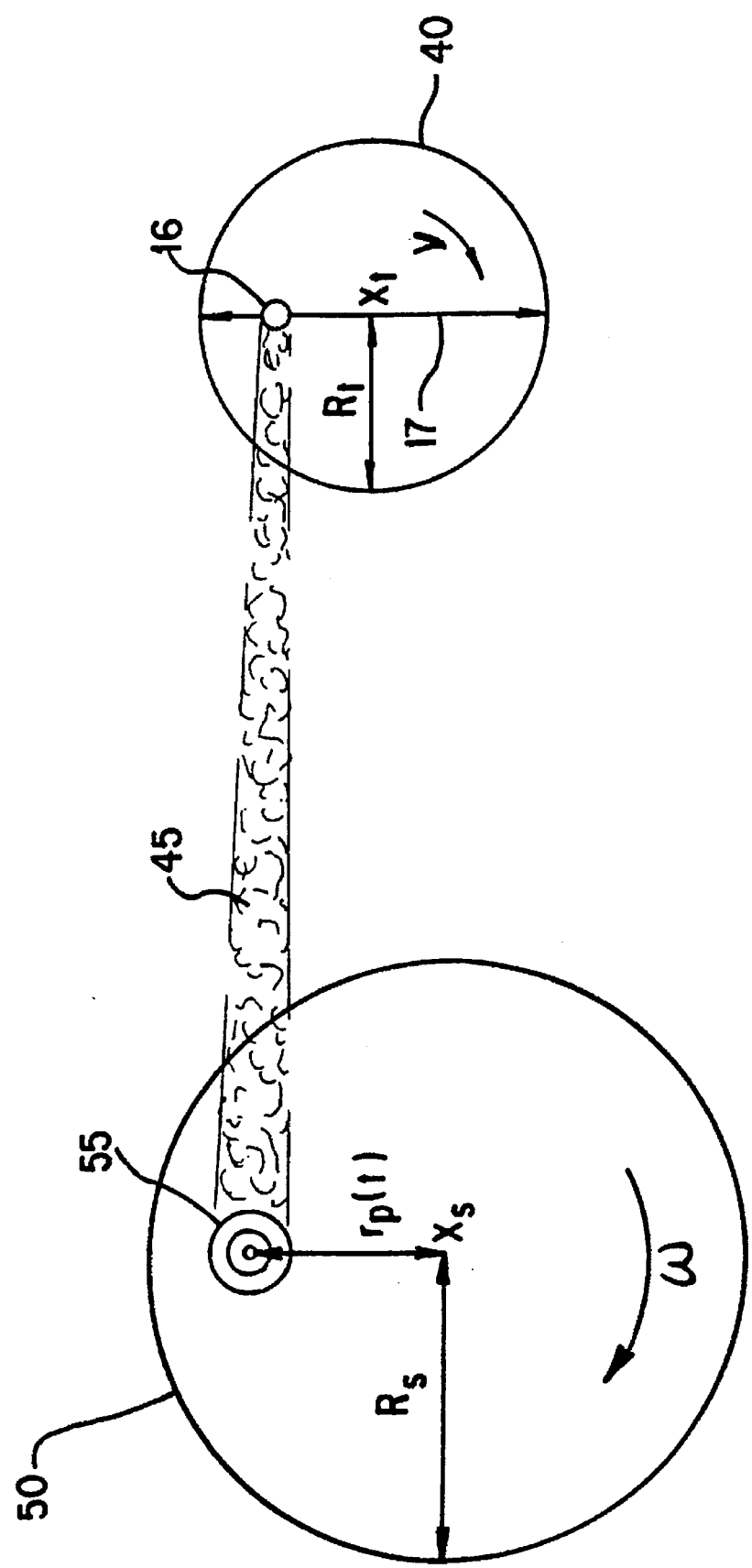
FIG. 1a is a schematic diagram illustrating laser beam-energized deposition of target evaporant onto a substrate.

Referring now to FIG. 1a, there is shown a schematic diagram illustrating a preferred operational arrangement incorporating the subject scanning laser beam delivery system. The subject scanning laser beam delivery system generally includes a laser beam source 10 for generating a pulsed laser beam 11 and a beam transfer assembly 20 optically coupled to laser beam source 10 for directing pulsed laser beam 11 along an optical path delineated by the dashed directional arrow 15 and for scanning a terminal segment 15' of that optical path 15 travelled by at least a portion of pulsed laser beam 11 to impinge upon a target evaporant 40. The scanning laser beam delivery system also includes a preferably programmable controller 30 coupled to a scanning mechanism 22 of beam transfer assembly 20 to reversibly displace the optical elements mounted together in an optical assembly 24 along the directions indicated by directional arrows 23, 23.

In the preferred operational arrangement of the scanning laser beam delivery system shown, laser beam source 10, is preferably a commercially-available excimer laser exhibiting suitable stability when operated at a fixed pulse rate f. One such excimer laser is a KrF excimer laser which preferably meets or exceeds the following operational specifications:

| | |
|---|---|
| Average Power | 150 W (e.g. 300 Hz @ 500 mJ) |
| Pulse Energy Stability | 3σ ≦ 3% |
| Operational Dynamic Gas Lifetime | 20 million pulses |
| Pointing Stability | ±100μ rad |
| Diverence (1/e²) | 2 mrad × 6 mrad |
| Beam Profile (Gaussian) | 70% Energy in Intensity |
| Short, Top Hat (Long), Pulse Duration | Interval 0.8 $I_{max}$ to $I_{max}$ 20–50 ns |

In the preferred operational arrangement, both the target evaporant 40 and substrate 50 contained within a vacuum chamber 60 are independently rotated, respectively about a target axis $X_t$ and a substrate axis $X_s$, by their support mechanisms 41 and 51. Irradiation of a spot on target evaporant 40 by the focused pulsed laser beam at terminal segment 15' causes the evaporation of material at that spot to fuel the generation of an evaporant plume 45. Rotation of target 40 insures that a substantially uniform supply of target evaporant material is continually available to maintain the evaporant density of plume 45 at a uniform level. With the evaporant density of plume 45 so maintained, the scanning of the laser radiation's terminal segment 15' causes the corresponding scan of plume 45 along the radial dimension of substrate 50, enabling the realization of uniform deposition along that dimension. The simultaneous rotation of substrate 50 about axis $X_s$ at the appropriate angular velocity enables all necessary portions of the substrate surface to be exposed to plume 45 and, thus, enables the realization of uniform deposition thereabout.

While the particular configurations of mechanisms 41, 51 for supporting and rotating the target and substrate are not part of the present invention, the parametric measures associated with the rotations they generate will affect the manner in which laser beam scanning is controlled by controller 30. The rationale for this is illustrated in the schematic diagram of FIG. 1a. As illustrated therein, target evaporant 40 having a radius $R_t$ will, at any instantaneous point in time during the deposition process, preferably be rotating about axis $X_t$ at a constant angular velocity Similarly, substrate 50 having a radius $R_s$ will preferably be rotating, at that same point in time, about axis $X_s$ with a constant angular velocity ω. The laser radiation impinging upon target evaporant 40 will form a focused radiation beam spot 16 from which evaporant plume 45 will project for deposition of evaporant material into the surface of substrate 50. At a given instant in time, deposition will occur with an instantaneous deposition profile 55 centered at an evaporant deposition point on the surface of substrate 50 that is a radial distance $r_p(t)$ away from axis $X_s$. With target evaporant 40 and substrate 50 appropriately positioned and oriented relative to one another and their radii chosen such that $R_t$ is approximately equal to one-half of $R_s$, laser beam scanning is effected by controller 30 across the entire diameter of target evaporant 40 such that beam spot 16 sweeps with a scan rate $V_p$ back and forth along the directional arrows 17. This, in turn, causes the instantaneous deposition profile 55 to sweep radially back and forth between substrate axis point $X_s$ and the periphery of substrate 50.

Note that as points on substrate 50 farther from axis point $X_s$ must travel with a greater linear speed than those points closer to axis point $X_s$, the scan rate $V_p$ cannot remain constant if full, let alone uniform, deposition coverage of the available deposition surface of substrate 50 is to occur. Scan rate $V_p$ must be controlled such that the farther away from the axis point $X_s$ the instantaneous deposition profile 55 is located, the slower it is swept. Conversely, $V_p$ must be controlled such that the closer to that axis point $X_s$ deposition profile 55 is located, the faster it is to be swept. Stated mathematically, scan rate $V_p$ must be inversely proportional to the distance at a given instant in time, or $r_p(t)$, of the instantaneous deposition profile 55 from axis point X. The actual degree of this proportionality and the necessity of any biasing of scan rate $V_p$ will, naturally, be determined by actual rotation parameter of the substrate and target. Thus, it is imperative for optimal deposition uniformity that controller 30 maintain precise control of the scan rate $V_p$ based on, among other parameters, the independently selected angular velocities ν and ω of target evaporant 40 and substrate 50.

The subject scanning laser beam delivery system effects such precise control of scan rate $V_p$ through controller 30 thereof; however, scan rate $V_p$ is not the only operational parameter of significance. For uniform deposition, it is highly desirable, and indeed quite necessary in practice, to preserve the focus of that portion of pulsed laser beam 11 impinging upon target 40, so that the shape and size of the radiation beam spot 16 generated thereby may be preserved.

Only then can the uniformity of the energy density which generates evaporant plume 45 be consistently maintained. Accordingly, in effecting beam scanning, the subject scanning laser beam delivery system displaces in unison all the optical elements necessary to form terminal segment 15' of the pulsed laser beam's optical path 15 in a direction substantially normal to the axial direction of that segment 15'. As there is no relative displacement between the optical elements that form terminal segment 15', nor any movements thereof to cause angular re-orientation of terminal segment 15'; only the location of radiation beam spot 16 is altered in the scanning process, its size and shape thus being substantially preserved.

Figure 2:
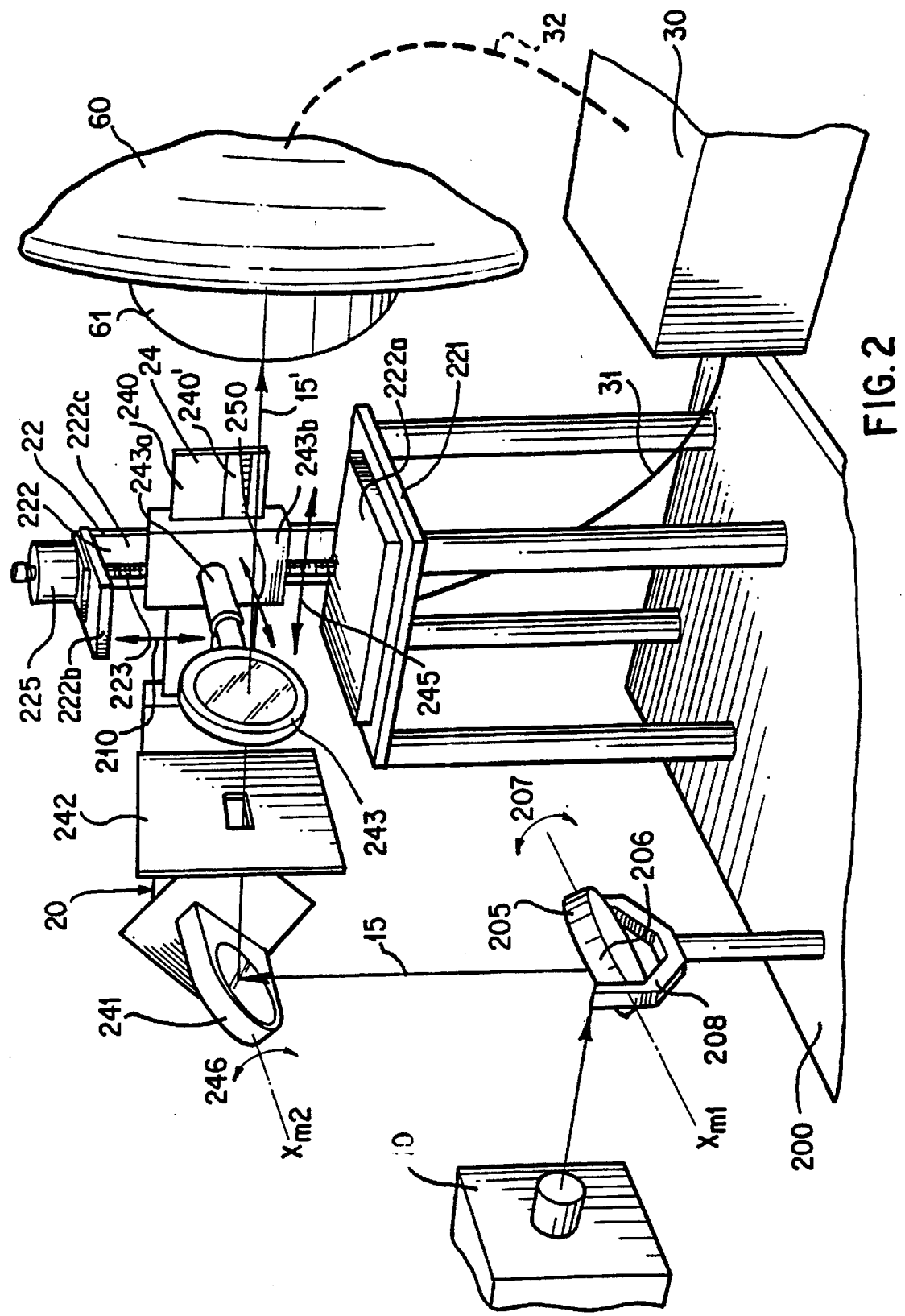
FIG. 2 is a perspective view, partially cut-away, of a preferred embodiment of the scanning laser beam delivery system of the present invention.
Figure 3:
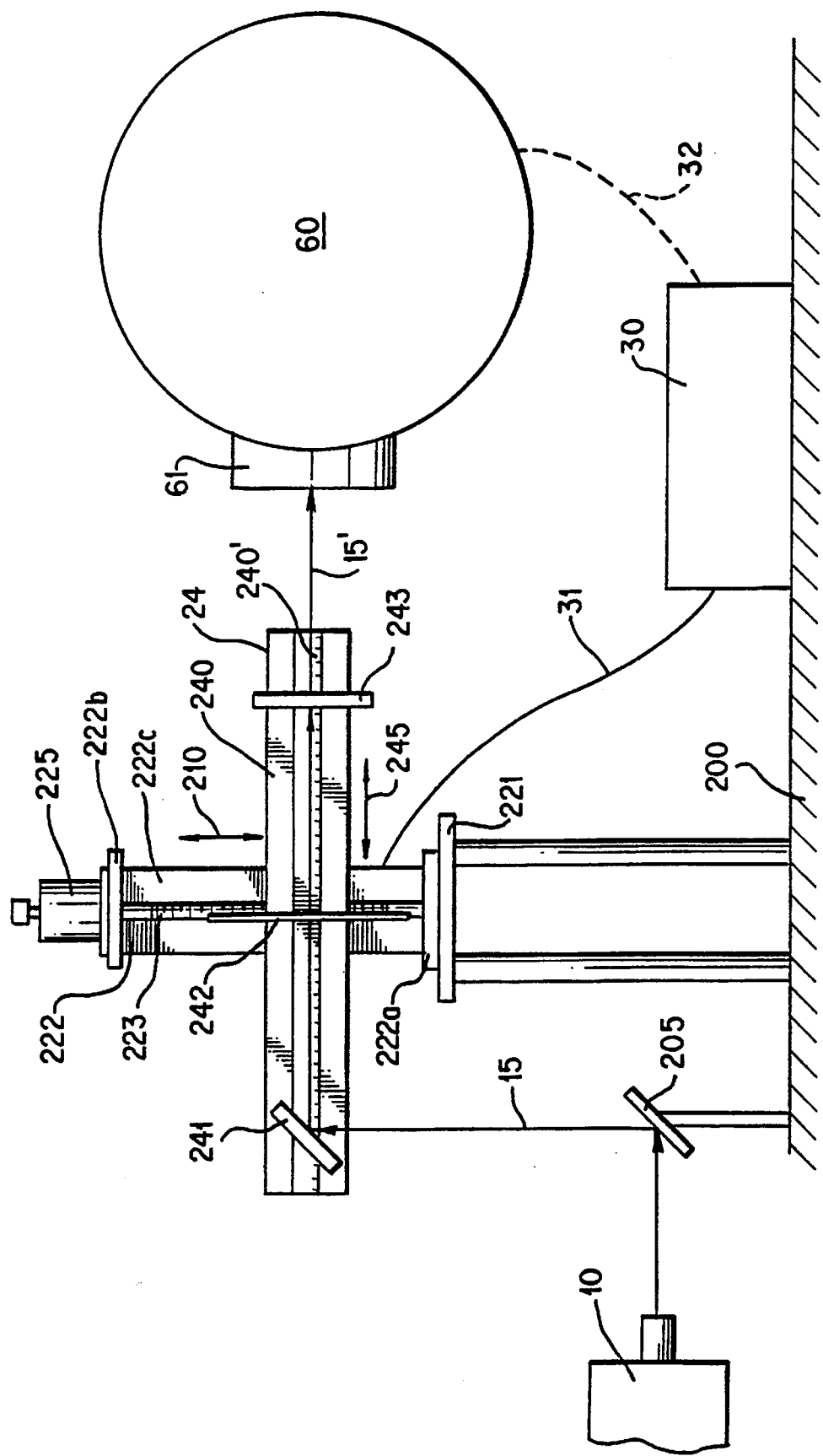
FIG. 3 is an elevational view, partially cut-away, of the preferred embodiment of the scanning laser beam delivery system shown in FIG. 2; and, FIG. 4 is a block diagram illustrating the operational steps implemented in the system controller mechanism.

Turning now to FIGS. 2 and 3, there is shown a more detailed view of the preferred embodiment of beam transfer assembly 20 in the subject scanning laser beam delivery system. Beam transfer assembly 20 is supported on a flat, stable platform 200 and preferably includes three basic units: a beam deflection mirror 205, an optical assembly 24, and a scanning mechanism 22. The component units of beam transfer assembly 20 collectively receive a pulsed laser beam generated by laser beam source 10, directs it along optical path 15, and forms and focuses the beam along terminal segment 15' which passes through a window 61 of vacuum chamber 60 to impinge upon the target evaporant 40 (not shown) supported therein. The scanning mechanism 22 is controlled by controller 30 in a scan direction which, as indicated by directional arrows 210, extends in a direction substantially normal to the extension of scan terminal segment 15'.

Note that the scan direction need not be vertically oriented as indicated by directional arrows 210; nor must it be oriented in a direction perfectly normal to the direction along which terminal segment 15' extends. Furthermore, the scan need not be limited to one linear direction. What is important is that the shape and size of radiation beam spot 16 (FIG. 1b) formed on the surface of target evaporant 40 by the laser beam at terminal segment 15' be consistently maintained over the full scanning range. Hence, the scan may be oriented in one of many directions, as determined by the orientation of the preferably planar surface of target evaporant 40 to be irradiated. If conditions permit, the scan may also be a non-linear scan, being cycled through numerous sequentially-varied directions. It is preferable for both simplicity and stability, however, to orient the target evaporant surface of interest in such a manner that the system is operable with a scan direction extending along one or both of the vertical or horizontal directions.

While, in the embodiment shown, laser beam source 10 is kept stationary and optical measures are taken in beam transfer assembly 20 to form terminal segment 15' so that only the terminal segment 15' need be scanned, laser beam source 10 itself may be coupled to beam transfer assembly 20 as part of the reversibly displaced optical assembly 24. It would obviate the need for beam deflection mirror unit 205; however, such an arrangement would, at best, make for a cumbersome optical assembly 24 and, at worst, result in the generation of an unstable pulsed laser beam. For mechanical simplicity and system operational stability, therefore, it is preferable to keep laser beam source 10 stationary and direct the pulsed laser beam accordingly to obtain a scannable optical path terminal segment 15'.

Beam deflection mirror unit 205 is preferably situated to directly receive the pulsed laser beam generated by laser beam source 10 and deflect the received pulsed laser beam to the optical assembly 24 such that the beam undergoes a 90° turn. The beam deflection angle may be adjusted simply by rotating mirror element 206 of mirror unit 205 about axis $X_{m1}$ as shown by the directional arrows 207. In order to enable this adjustability, mirror element 206 is pivotally retained between two arms of a base 208 which is fixedly secured at its bottom to platform 200. Mirror element 206 may be secured in its angular orientation once adjustment is made by any suitable securing means such as a screw fastener (not shown) passing through one arm of base 208 along axis $X_{m1}$. The particular choice of such a securing mechanism is not important to the present invention and may be one of many commercially available models.

The optical assembly 24 includes a deflection mirror unit 241, an aperture element 242, and a focusing lens unit 243, each of which is adjustably secured to a cross-beam 240. Beam deflection mirror unit 241 is secured to cross-beam 240 by any suitable securing mechanism such that it may be re-positioned along the length of cross-beam 240 as indicated by directional arrows 245 to be optically coupled to mirror element 206 of beam deflection mirror unit 205. Dimensional indicia 240' are provided along cross-beam 240 to aid a user in performing this adjustment.

The mirror element of unit 241 deflects the pulsed laser beam reflected by beam deflection mirror unit 205 to pass through the other optical elements of assembly 24 and impinge upon the target evaporant. It is, thus, important that the angular orientation of the mirror element of unit 241 about axis $X_{m2}$ be carefully adjusted prior to system operation in the directions indicated by directional arrows 246. Any suitable pivoting mechanism may be incorporated into the securing mechanism by which beam deflection unit 241 is secured to cross-beam 240 to enable this adjustability.

The pulsed laser beam generated by laser beam source 10 and deflected by deflection units 205 and 241 typically does not exhibit uniform cross-sectional energy distribution. Given the importance to uniform deposition of energy density uniformity in that portion of the beam impinging upon the target evaporant, it is preferable to insert into path 15 an aperture element 242 to block the peripheral portions of the beam determined to exhibit insufficiently uniform energy levels. Aperture element 242 may be of any suitable type well-known in the art to the extent that it is formed of a material sufficiently impenetrable to the given pulsed laser beam. It is formed with an aperture located as shown and having a rectangular or other shape necessitated by the energy distribution profile characteristic of given pulsed laser beam to allow passage of only the central portion of that beam which exhibits acceptably uniform energy distribution therethrough.

That portion of the pulsed laser beam passing through aperture element 242 next passes through a focusing lens 243 also mounted to cross-beam 240 via a mounting base 243a. In configuring the scanning laser beam delivery system for proper operation, it is important that the terminal portion of the pulsed laser beam be optimally focused to impinge upon target evaporant 40. Accordingly, the coupling of base 243a to cross-beam 240 is such that it may be adjusted in position along the direction 245 and locked at the appropriate position. Base 243a is provided with a suitable mechanism to enable such coupling and a suitable mechanism to receive the stem portion of focusing lens 243 in adjustable manner in order that focusing lens 243 may be precisely adjusted in position along the directions indicated by directional arrows. 250 prior to system operation.

Alignment of beam deflection unit 241, aperture element 242, and focusing lens 243 in the vertical direction 210 may be set by individually adjusting each element through an adjustment mechanism, the adjustment means for that element (not shown). While such a mechanism may be incorporated into each of the elements, it is preferable that the base assemblies by which they respectively couple to cross-beam 240 be configured with sufficient likeness that alignment of the elements along the directions 210 results simply by virtue of their proper coupling to cross-beam 240.

Optical assembly 24, comprising the optical elements 241–243 mounted to cross-beam 240, is coupled to scanning mechanism 22 for displacement thereof as indicated by arrows 210. This, naturally, results in the translational sweep of terminal segment 15' across target evaporant 40 without the required displacement of laser beam source 10, nor the relative displacement of any optical elements 241–243. Scanning mechanism 22 includes a vertical shift optical mount assembly 222 securely and stably supported on a table 221 resting on platform 200, and is electromechanically actuated by a stepped motor 225 mounted thereto.

Vertical shift optical mount 222 may be one of numerous models commercially available. For instance, it may be the UniSlide Power Stand with Slider, Model No. VMB4009WIJ-S4, available from Velmex, Inc. of Bloomfield, N.Y., or it may be a comparable unit available from sources such as Mells-Griot, Oriel, or Newport. Preferably, all portions of vertical shift optical mount assembly 222 are formed of steel or other material of comparable strength. Assembly 222 includes a base portion 222a, an upper ledge portion 222b, and an upright back portion 222c extending therebetween. Assembly 222 also includes an externally-threaded screw drive shaft 223 revolvably coupled to and extending axially from the upper ledge portion 222b to the base portion 222a. The upper end of screw drive 223 extends through the upper ledge portion 222b so that it may be mechanically coupled to stepped motor 225 or other suitable actuating mechanism.

Optical assembly 24 is coupled to screw drive shaft 223 in any suitable manner such that as screw drive shaft 223 is rotated in one direction about its axis, optical assembly 24 is displaced along the direction indicated by one of the arrows 210, and is displaced in the direction indicated by the other of the two arrows 210 when screw drive 223 is rotated in the opposite direction. This coupling is not shown as the particularities of its structural features do not form any part of the present invention. In general terms, however, the coupling is preferably realized by passing screw drive shaft 223 vertically through an internally threaded passage formed into a rear extension of cross-beam 240. The threading of screw drive 223 and the threaded passage on that rear portion of cross-beam 240 are such that they mesh snugly and securely. For enhanced stability, a rear extension of cross-beam 240 may also engage the upright back portion 222c of assembly 222 in a slidable manner such that the screw drive shaft 223 is not unduly exposed to laterally-directed forces.

Stepped motor 225 may be one of numerous types commercially available such as the Superior Electric Motor, Model No. M062-LS09 available from Velmex, Inc. It is important that stepped motor 225 provide sufficiently fine movement resolution and that it respond sufficiently quickly to an actuating signal in order that the necessary precision in scan rate control may be realized.

Turning now to programmable controller 30, such is preferably a microprocessor-based system having the necessary processing capabilities, short and long term data storage capacity, and the necessary user and data interfaces to effect proper operation of the subject scanning laser beam delivery system under the given operational conditions. Controller 30 is electrically coupled to stepped motor 225 via a data link 31 for hi-directional passage of control and sense signals therethrough. Via this link, stepped motor 225 may be variably actuated and stopped depending, among other parameters, on the instantaneous position of optical assembly 24 relative to a reference position.

If a fully 'closed loop' operation of the subject scanning laser beam delivery system is to be realized, the conditions monitored by controller 30 in controlling laser beam scan may include those conditions within vacuum chamber 60 associated with target 40, substrate 50, or their support mechanisms 41, 51. The conditions sensed within chamber 60 may then be fed back to the scanning operation. A data link for passage of sensing signals for signals indicative of such conditions to controller 30 is shown by the dashed connection 32. While such a closed loop operation may further enhance the uniformity of deposition realized by the given system, it was found by experimentation that sufficient deposition uniformity was attainable without so 'closing' the loop. The preferred embodiments, therefore, operates without data link 32.

Figure 4:
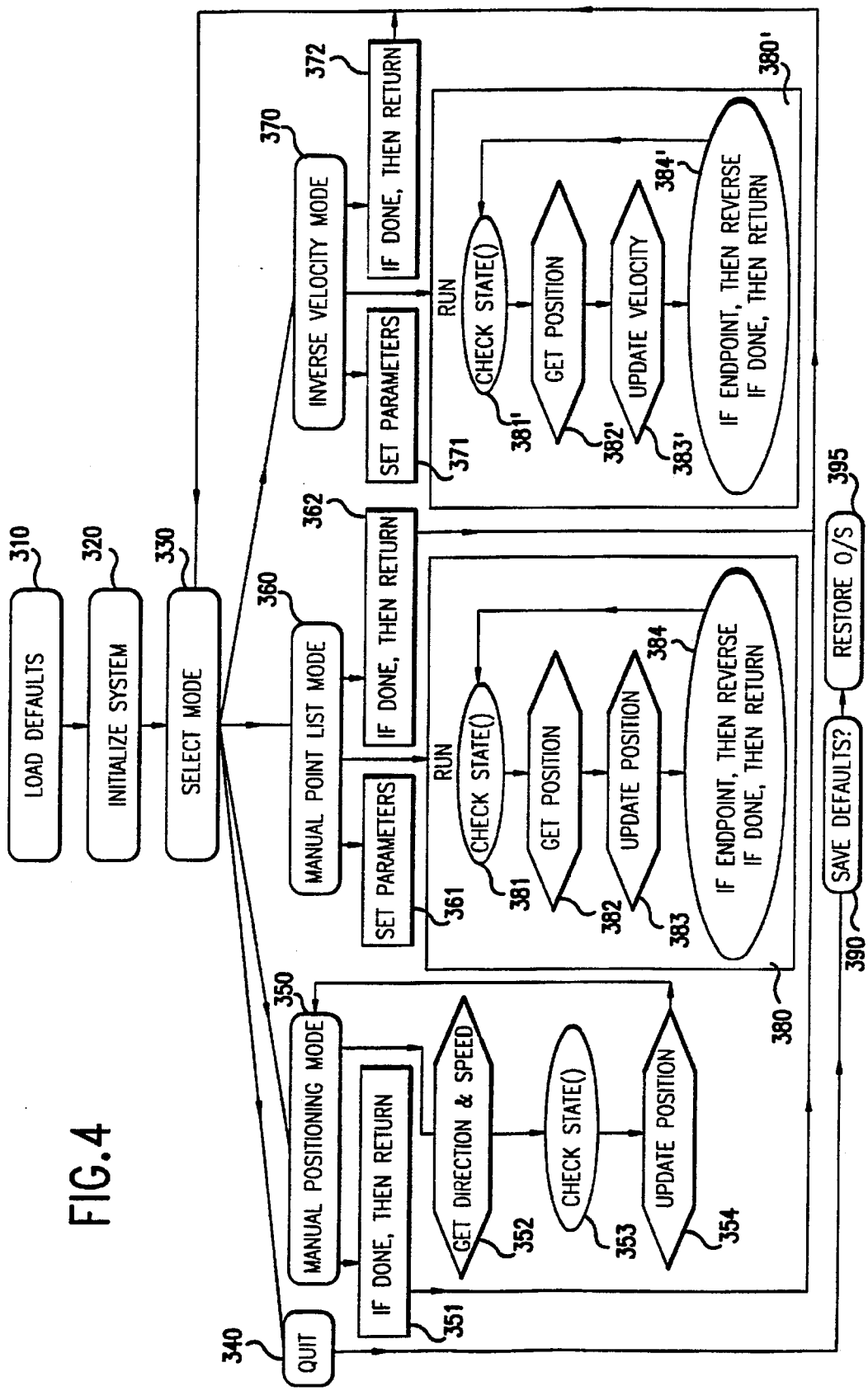

Referring now to FIG. 4, there is shown a flow chart illustrating the operational steps programmed into controller 30 to effect proper laser beam scan. The operational flow commences at block 310 wherein default parameter values are read and loaded into the temporary memory of controller 30. Thereupon, a signal is passed to block 320 wherein the appropriate parametric variables are set to their initial values. A signal is then passed to block 330 for the selection therein of one of several available scanning modes: the Manual Positioning Mode 350, the Manual Point List Mode 360, or the Inverse Velocity Mode 370. An alternative to the scanning modes at block 330 is selection of the quit block 340 for termination of the scan operation. If the quit block 340 is selected, a signal is passed to block 390 wherein the user is prompted as to whether or not the current values of the default parameters should be saved. After appropriate processing responsive to the user's communicated reply, a signal passes to the Restore O/S block 395 wherein control is relinquished to the operating system resident on controller 30.

The Manual Positioning Mode of operation indicated by block 350 enables the user either to incrementally position optical assembly 24 (FIGS. 2–3) along directions 210 by discretely entering the relative positions of interest according to a coordinate system maintained within controller 30, or by directly entering the direction and speed of scan desired for a given scan increment. In either case, the direction and speed for the given scan increment, whether directly entered by the user or computed by controller 30 from user-entered positions are passed to block 353. At block 353, the scan state, as indicated by parameters such as the instantaneous position of optical assembly 24 and the position of deposition profile 55 (FIG. 1b) relative to the edge of substrate 50, is checked. To the extent permitted by the check at block 353, the position of optical assembly 24 is updated at block 354, and stepped motor 255 is actuated in the appropriate manner to place optical assembly 24 at the updated position (FIGS. 2–3). A return signal is then passed to block 350 to repeat the foregoing process or to pass a signal to block 351 for return of the operational flow to Select Mode block 330.

The Manual Point List Mode is indicated at block 360. In this mode of operation, scanning of optical assembly 24 along directions 210 (FIGS. 2–3) is controlled according to a predetermined 'script' of scanning positions or movements. In this mode, scanning is performed when a signal is passed to Run block 380. Within that Run block 380, check of the scan state is performed in block 381 in a manner similar to the check performed in block 353 in the Manual Positioning Mode. Subsequent to this check, the current position of optical assembly 24 is obtained at block 382. A signal is then passed to block 383 wherein a file containing the 'script' to be followed by the scan is read, and the next position for optical assembly 24 is updated. Following actuation of stepped motor 255 to appropriately re-position optical assembly 24 (FIGS. 2–3), a check is made at block 384 to determine if a scan end point has been reached. If so, scan direction is reversed, and a signal is passed to block 381 for a repeat of the foregoing steps. If, at block 384, there is a determination that the end point of the scan file has been reached, operational flow is returned to block 360 which, in turn, returns the operational flow via block 362 to block 330.

Prior to, during, or after the running of block 380, values of appropriate parameters may be set in block 361. It may be necessary prior to operation of the steps in block 380 that certain parameters be set in light of the contents of the scan file to be implemented.

The Inverse Velocity Mode indicated at block 370 is the automatic mode of operation wherein scanning is actively controlled by controller 30 based upon parameters indicative of various operational conditions. When this mode is selected at block 330, a signal is passed to block 371 wherein values for the necessary parameters for this mode of operation are appropriately set. Values for selected parameters may not only be set prior to operation of the Run block 380', but may also be set during and/or after the operation of block 380'.

At the appropriate time, a signal is passed to Run block 380' wherein a check is made at block 381' of the current scan state. Following that check, a signal is passed to block 382' wherein the current position of optical assembly 24 is read. The velocity for the next scan interval is updated at block 383' based upon current values of operational condition parameters such as current scan position, prior scan position, target rotation rate v, substrate rotation rate ω, target radius $R_t$, substrate radius $R_s$, and laser frequency f. The operational flow then passes to block 384', and a determination is made as to whether or not the scan limit has been reached. If so, the scan direction is reversed, and operational flow proceeds to block 381' for iterative repeat of the foregoing steps. If at block 384' an appropriate parameter indicates that scanning ought to terminate, the flow returns to block 370 which, in turn, passes a return signal to Select Mode block 330 via block 372.

Although the present invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended Claims.

What is claimed is:

1. A scanning laser beam delivery system for pulsed laser deposition of an evaporant material onto a substrate rotating about a substrate axis comprising:

(a) a laser beam source for generating a pulsed laser beam;

(b) a target evaporant disposed in spaced relation to said laser beam source having said evaporant material formed thereon;

(c) a beam transfer assembly optically coupled to said laser beam source for directing said pulsed laser beam along an optical path having a terminal segment impinging upon said target evaporant to form a radiation beam spot thereon, said terminal segment having a directional component parallel to a longitudinal direction, said beam transfer assembly including scanning means for reversibly translating said terminal segment of said optical path along a scan direction substantially normal to said longitudinal direction; and, (d) control means coupled to said beam transfer assembly for automatically controlling actuation of said scanning means, whereby at least a portion of said evaporant material of said target evaporant is substantially uniformly deposited onto said substrate.

2. The scanning laser beam delivery system as recited in claim 1 including means for rotating said target evaporant about a target axis during said reversible translation of said terminal segment of said optical path in said scan direction.

3. The scanning laser beam delivery system as recited in claim 2 wherein said control means controls actuation of said scanning means to reversibly translate said terminal segment of said optical path in said scan direction at a variable scan rate, said scan rate being determined responsive to the instantaneous radial position of said radiation beam spot on said target evaporant relative to said target axis.

4. The scanning laser beam delivery system as recited in claim 2 wherein said control means controls actuation of said scanning means to reversibly translate said terminal segment of said optical path in said scan direction at a variable scan rate, said scan rate being inversely proportional to a deposition point parameter indicative of the instantaneous radial position relative to said substrate axis of an evaporant deposition point on said substrate.

5. The scanning laser beam delivery system as recited in claim 1 wherein said beam transfer assembly includes first and second mirror elements for cooperatively directing said pulsed laser beam along at least a portion of said optical path, said first mirror element being disposed adjacent said laser beam source.

6. The scanning laser beam delivery system as recited in claim 5 wherein said beam transfer assembly includes an aperture element disposed in said optical path for passage therethrough of a predetermined portion of said pulsed laser beam, said aperture element blocking substantially all portions of said pulsed laser beam not within said predetermined portion thereof.

7. The scanning laser beam delivery system as recited in claim 6 wherein said beam transfer assembly includes a focusing lens for focusing said predetermined portion of said pulsed laser beam passing through said aperture element onto at least a portion of said target evaporant.

8. The scanning laser beam delivery system as recited in claim 7 wherein said beam transfer assembly includes a cross-beam reversibly displaceable in said scan direction, said cross-beam having mounted thereon said second mirror element, said aperture element, and said focusing lens.

9. A scanning laser beam delivery system for pulsed laser deposition of an evaporant material onto a substrate rotating about a substrate axis comprising:

(a) a laser beam source for generating a pulsed laser beam;

(b) a target evaporant disposed in spaced relation to said laser beam source and having formed thereon said evaporant material;

(c) a beam transfer assembly optically coupled to said laser beam source for directing said pulsed laser beam along an optical path having a terminal segment impinging upon said target evaporant to form a radiation beam spot characterized by a beam spot shape and a beam spot size, said beam transfer assembly including scanning means for reversibly translating said terminal segment of said optical path along a scan direction; and, (d) control means coupled to said beam transfer assembly for automatically controlling actuation of said scanning means responsive to a plurality of operational parameters, said control means controlling actuation of said scanning means in a manner that substantially preserves both said beam spot shape and said beam spot size.

10. The scanning laser beam delivery system as recited in claim 9 wherein said control means controls actuation of said scanning means in a manner wherein said terminal segment of said optical path is reversibly translated in said scan direction at a rate inversely proportional to a deposition point parameter indicative of the instantaneous radial position relative to said substrate axis of an evaporant deposition point on said substrate.

11. The scanning laser beam delivery system as recited in claim 9 wherein said beam transfer assembly includes first and second mirror elements for cooperatively directing said pulsed laser beam along at least a portion of said optical path, said first mirror element being disposed adjacent said laser beam source.

12. The scanning laser beam delivery system as recited in claim 11 wherein said beam transfer assembly includes an aperture element disposed in said optical path for passage therethrough of a predetermined portion of said pulsed laser beam, said aperture element blocking substantially all portions of said pulsed laser beam not within said predetermined portion thereof.

13. The scanning laser beam delivery system as recited in claim 12 wherein said beam transfer assembly includes a focusing lens for focusing said predetermined portion of said pulsed laser beam passing through said aperture element onto at least a portion of said target evaporant.

14. The scanning laser beam delivery system as recited in claim 13 wherein said beam transfer assembly includes a cross-beam reversibly displaceable in said scan direction, said cross-beam having mounted thereon said second mirror element, said aperture element, and said focusing lens.

15. A scanning laser beam delivery system for pulsed laser deposition of an evaporant material onto a substrate rotating about a substrate axis comprising:

(a) a laser beam source for generating a pulsed laser beam, said pulsed laser beam travelling through an optical path;

(b) a target evaporant disposed in spaced relation to said laser beam source and having formed thereon said evaporant material;

(c) an optical assembly intermediately disposed in said optical path between said laser beam source and said target evaporant, said optical assembly including a focusing lens adapted to focus at least a predetermined portion of said pulsed laser beam to impinge upon at least a portion of said target evaporant to form thereon a radiation beam spot characterized by a beam spot shape and a beam spot size; and, (d) scanning means coupled to said optical assembly for automatically and reversibly displacing said optical assembly along a scan direction in a manner that substantially preserves both said beam spot shape and said beam spot size.

16. The scanning laser beam delivery system as recited in claim 15 wherein said scanning means reversibly displaces said optical assembly in said scan direction at a variable scan rate.

17. The scanning laser beam delivery system as recited in claim 16 including means for rotating said target evaporant about a target axis during said reversible displacement of said optical assembly in said scan direction.

18. The scanning laser beam delivery system as recited in claim 17 wherein said scan rate is determined responsive to the instantaneous radial position of said radiation beam spot on said target evaporant relative to said target axis.

19. The scanning laser beam delivery system as recited in claim 16 wherein said scan rate is inversely proportional to a deposition point parameter indicative of the instantaneous radial position relative to said substrate axis of an evaporant deposition point on said substrate.

20. The scanning laser beam delivery system as recited in claim 15 wherein said optical assembly includes an aperture element disposed adjacent said focusing lens for blocking substantially all portions of said pulsed laser beam not within said predetermined portion thereof.

* * * * *